United States Patent
Ko

[11] Patent Number: 5,955,912
[45] Date of Patent: Sep. 21, 1999

[54] MULTIPLEXER CIRCUITS

[75] Inventor: Uming Ko, Plano, Tex.

[73] Assignee: Texas Instruments Incorporated, Dallas, Tex.

[21] Appl. No.: 08/736,465

[22] Filed: Oct. 24, 1996

Related U.S. Application Data

[60] Provisional application No. 60/007,033, Oct. 25, 1995.

[51] Int. Cl.⁶ .................................................. H03K 17/62
[52] U.S. Cl. ........................... 327/410; 327/404; 326/113
[58] Field of Search ........................... 327/404, 407–413; 326/56–58, 113

[56] References Cited

U.S. PATENT DOCUMENTS

| | | | |
|---|---|---|---|
| 5,162,666 | 11/1992 | Tran | 327/408 |
| 5,233,233 | 8/1993 | Inoue et al. | 327/408 |
| 5,744,995 | 4/1998 | Young | 327/408 |

FOREIGN PATENT DOCUMENTS

| | | | |
|---|---|---|---|
| 273120 | 7/1988 | European Pat. Off. | 327/408 |
| 6-196993 | 7/1994 | Japan | 327/408 |
| 2278970 | 12/1994 | United Kingdom | 327/408 |

*Primary Examiner*—Kenneth B. Wells
*Attorney, Agent, or Firm*—Robert D. Marshall, Jr.; Gerald E. Laws; Richard L. Donaldson

[57] ABSTRACT

A multiplexer has first, second, third and fourth inputs receiving respective first, second, third and fourth input signals, having first and second control inputs receiving respective first and second select input signals and an output. Each of the four input signals is supplied to the input of a CMOS transmission gate. The first and second transmission gates are clocked via the first select signal and its inverse in a first phase. The third and fourth transmission gates are clocked via the first select signal and its inverse in a second phase, opposite to the first phase. A first embodiment includes a first intermediate inverter having an input connected jointly to the outputs of the first and second transmission gates and a second intermediate inverter having an input connected jointly to the outputs of the third and fourth transmission gates. The multiplexer output is provides by a fifth and a sixth transmission gate oppositely clocked via the second control signal input and coupled to the first and second intermediate inverters, respectively. A second embodiment employs double pass logic in place of the fifth and sixth transmission gates and an output inverter. A third embodiment employs two oppositely clocked tristate inverters for output. A fourth embodiment employs N-type MOSFETs instead of transmission gates. A P-type MOSFET provides feedback to an output inverter to reduce possible static power dissipation.

6 Claims, 6 Drawing Sheets

MULTIPLEXER CIRCUITS

This application claims priority under 35 U.S.C. 119(e)(1) of the provisional application No. 60/007,033 filed Oct. 25, 1995.

TECHNICAL FIELD OF THE INVENTION

The technical field of this invention is electronic circuits and particularly multiplexers.

BACKGROUND OF THE INVENTION

Multiplexers are frequently used in control logic to perform a select or a decode function. This application is primarily concerned with 4-to-1 multiplexers. Such a multiplexer is illustrated schematically in FIG. 1. Multiplexer 100 receives four input signals, I1, I2, I3 and I4, are respective input terminals. Multiplexer 100 also receives two select signals, S0 and S1, at respective control terminals. Multiplexer 100 supplies an inverted version of one of the input signals I1 to I4 to its output terminal depending on the state of the two selection signals S0 and S1. Table 1 shows the truth table of multiplexer 100.

TABLE 1

| S0 | S1 | Output |
|----|----|--------|
| 0  | 0  | I1     |
| 0  | 1  | I2     |
| 1  | 0  | I3     |
| 1  | 1  | I4     |

FIG. 2 illustrates a prior art circuit embodying a multiplexer 110. This prior art multiplexer 110 implements a one-stage decode of the select lines via inverters 201 and 202, and NOR gates 221, 222, 223 and 224. Depending on the state of select signals S0 and S1 only one of NOR gates 221, 222, 223 and 224 is active. The active NOR gate 221, 222, 223 or 224 together with the corresponding inverter 231, 232, 233 or 234 enables one of the four transmission gates 211, 212, 213 or 214. The outputs of transmission gates 211, 212, 213 and 214 are connected in a wired OR fashion to the input of inverter 240. Because only one of transmission gates 211, 212, 213 and 214 is enabled at any time no actual logical OR function takes places in this wired OR input to inverter 240. Inverter 240 provides final inversion as well as output buffering. This circuit requires 38 transistors (note NOR gates 211, 222, 223 and 224 require 4 transistors each). This prior art multiplexer 110 minimizes delay from the data inputs to output at the expense of longer delay paths from the select inputs to data output. For the worst case path delay, inputs S0, S1, and any input I1, I2, I3 or I4 have to traverse six, six, and two (6/6/2) transistors to output, respectively.

FIG. 3 illustrates a modular design approach. The multiplexer 120 includes three 2-to-1 multiplexers. A first 2-to-1 multiplexer consists of transmission gates 211 and 212 and inverter 241. Transmission gates 211 and 212 are driven in the opposite phase from the select signal S0 and its inverse provided by inverter 201. A second 2-to-1 multiplexer consists of transmission gates 213 and 214 and inverter 242. The outputs of these two 2-to-1 multiplexers at inverters 241 and 242 are connected to the third 2-to-1 inverter consisting of transmission gates 215 and 216 and inverter 243. Inverter 240 provided at the output maintains the inverting attribute of multiplexer 120. The multiplexer 120 includes a total of 24 transistors, which represents a 58% reduction in transistor count relative to the prior art multiplexer 110 illustrated in FIG. 2. This area reduction is at the expense of a greater gate delay. The worst case path delay from inputs S0, S1, and any input I1, I2, I3 or I4 is six, four, and five (6/4/5), respectively.

A third prior art multiplexer 130 is illustrated in FIG. 4. Three redundant inverters 241, 242 and 243 of multiplexer 120 illustrated in FIG. 2 are eliminated. This leads to the structure called TG-TG-INV for transmission gate, transmission gate and inverter illustrated in FIG. 4. The TG-TG-INV multiplexer 130 illustrated in FIG. 4 requires 18 transistors. Compared to the prior art multiplexer 110, the TG-TG-INV multiplexer 130 uses a factor of 2.1 fewer transistors. The input to output path delay has been reduced from 6/6/2 of multiplexer 110 to 4/3/3. Both the multiplexer 120 formed of three 2-to-1 multiplexers and the TG-TG-INV multiplexer 130 utilize two-stage decode and therefore have a more balanced delay from each input to the output when compared to the prior art multiplexer 110.

SUMMARY OF THE INVENTION

This invention relates to 4-to-1 multiplexers having first, second, third and fourth inputs receiving respective first, second, third and fourth input signals, having first and second control inputs receiving respective first and second select input signals and an output. These 4-to-1 multiplexers couple the input at one of the four inputs to the output corresponding to the first and second control inputs. The 4-to-1 multiplexer includes first and second control signal inverters for inverting the respective first and second select inputs. Each of the four input signals is supplied to the input of a CMOS transmission gate. The first and second transmission gates are clocked via the first select signal and its inverse in a first phase. The third and fourth transmission gates are clocked via the first select signal and its inverse in a second phase, opposite to the first phase.

A first embodiment includes a first intermediate inverter having an input connected jointly to the outputs of the first and second transmission gates and a second intermediate inverter having an input connected jointly to the outputs of the third and fourth transmission gates. A fifth transmission gate has an input connected to the output of the first intermediate inverter and is clocked via the second control signal input and its inverse in a first phase. A sixth transmission gate has an input connected to the output of the second intermediate inverter and is clocked via the second control signal input and it inverse in a second phase opposite to the first phase. The outputs of the fifth and sixth transmission gates jointly form the output of the 4-to-1 multiplexer.

A second embodiment employs double pass logic in place of the fifth and sixth transmission gates. This embodiment employs an output inverter to form the 4-to-1 multiplexer output.

A third embodiment employs two oppositely clocked tristate inverters for output. A first tristate inverter has an input connected to the first and third transmission gates. A second tristate inverter has an input connected to the second and fourth transmission gates. The outputs of the first and second tristate inverters jointly form the output of the 4-to-1 multiplexer.

A fourth embodiment employs N-type MOSFETs instead of transmission gates. A P-type MOSFET provides feedback to an output inverter to reduce possible static power dissipation.

BRIEF DESCRIPTION OF THE DRAWINGS

These and other aspects of this invention are illustrated in the drawings, in which.

DETAILED DESCRIPTION OF PREFERRED EMBODIMENTS

Figure 1:
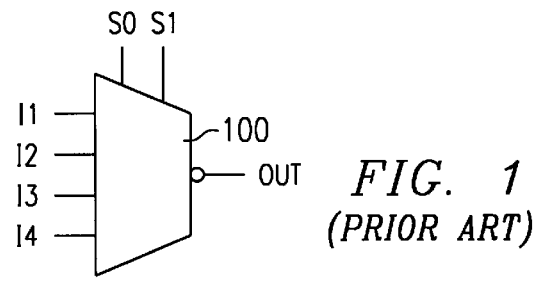
FIG. 1 illustrates in block diagram form a 4-to-1 multiplexer.
Figure 2:
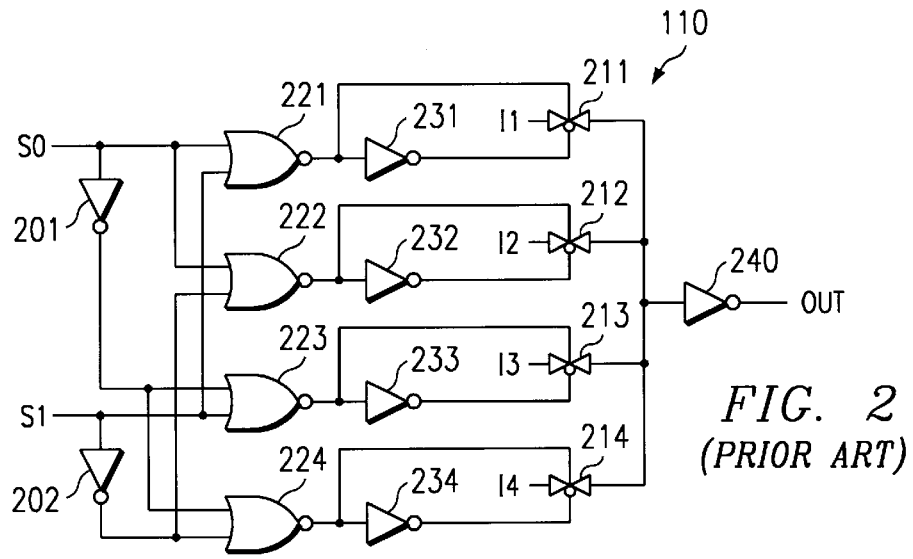
FIG. 2 illustrates a conventional prior art 4-to-1 multiplexer.
Figure 3:
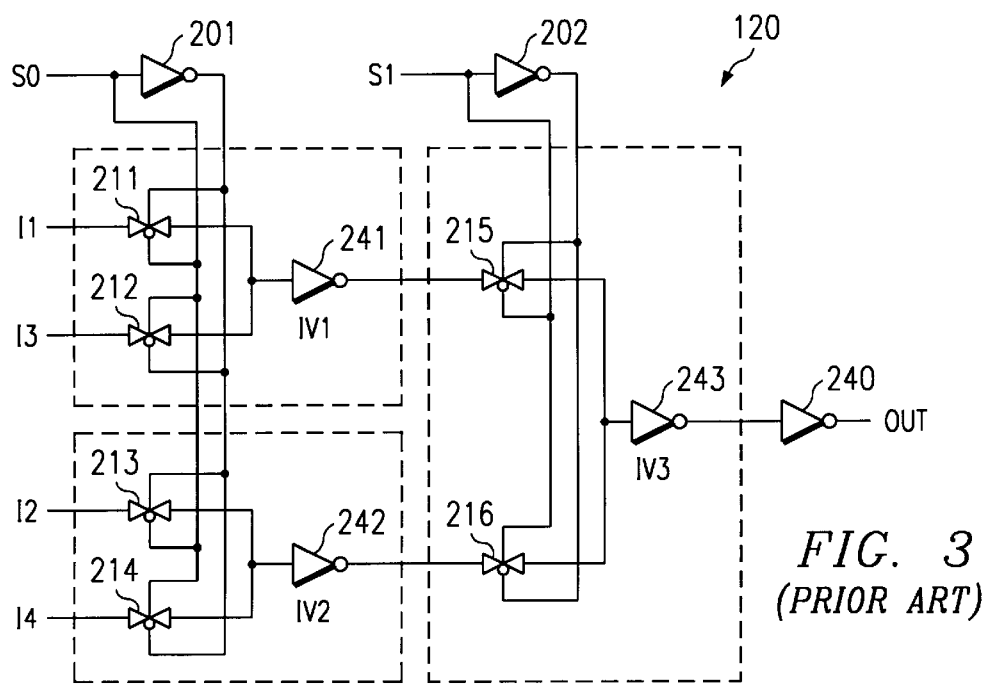
FIG. 3 illustrates a prior art 4-to-1 multiplexer formed of three 2-to-1 multiplexers.
Figure 4:
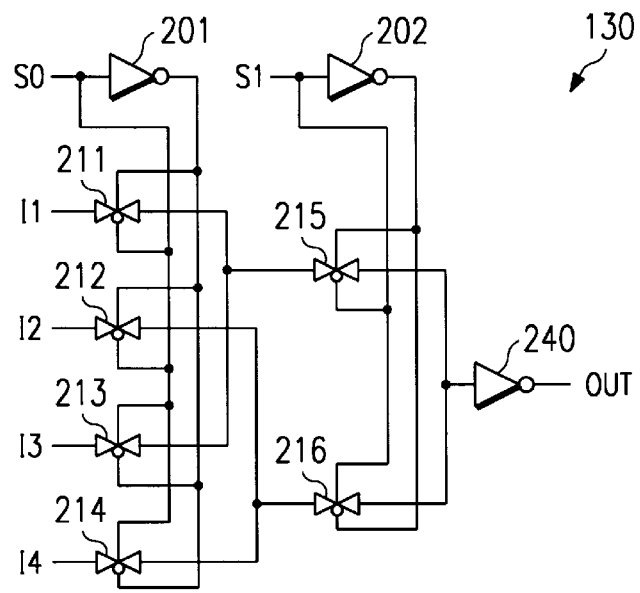
FIG. 4 illustrates a prior art transmission gate-transmission gate-inverter 4-to-1 multiplexer.
Figure 5:
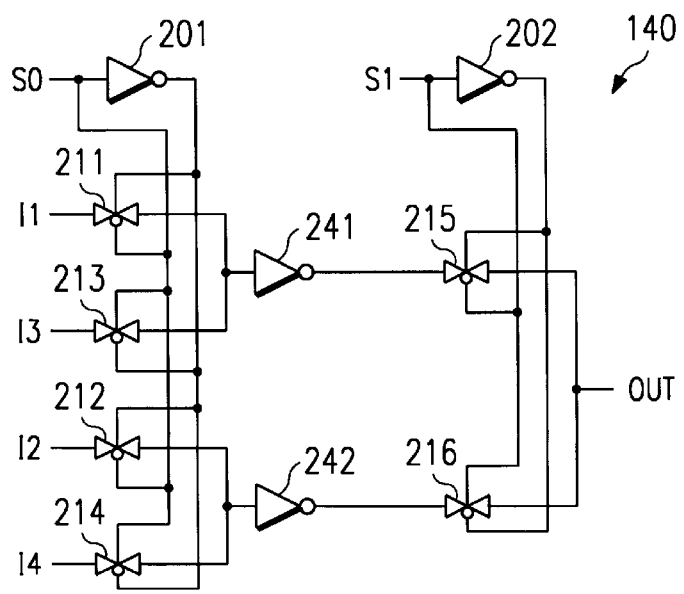
FIG. 5 illustrates a transmission gate-inverter-transmission gate 4-to-1 multiplexer according to one embodiment of this invention.

A major contributor of delay in the TG-TG-INV multiplexer 130 illustrated in FIG. 4 is the path including two serial, passive transmission gates. One embodiment of this invention replaces the output inverter of TG-TG-INV multiplexer 130 with two inverters and insert these two inverters between the two serial transmission gates. This leads to the structure called TG-INV-TG for transmission gate, inverter and transmission gate illustrated in FIG. 5. This TG-INV-TG multiplexer 140 may also be viewed as derived from the multiplexer 120 by elimination of the redundant inverters 243 and 240. The TG-INV-TG multiplexer 140 utilizes 20 transistors. This is more than used in the TG-TG-INV multiplexer 130 but reduces one transistor delay from the S1 input to output and achieves a worst case path delay of 4/2/3.

Figure 6:
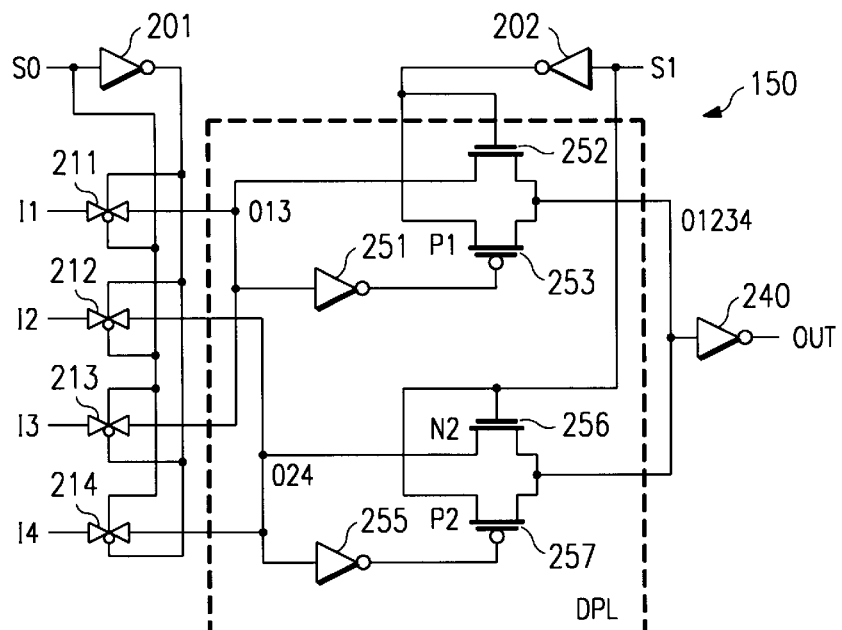
FIG. 6 illustrates a transmission gate-double pass logic-transmission gate 4-to-1 multiplexer according to another embodiment of this invention.

FIG. 6 illustrates another embodiment of this invention. The speed of the TG-INV-TG multiplexer 140 illustrated in FIG. 4 can be improved by replacing the transmission gates 215 and 216 with double pass-transistor logic. This structure called TG-DPL-INV for transmission gate, double pass logic, inverter is illustrated in FIG. 6. The double pass logic technique is applied to the second transmission gates of the TG-TG-INV multiplexer 140 with internally generated dual-rail intermediate signals. The N-type MOSFET 252 and the P-type MOSFET 253 replaces transmission gate 215. The N-type MOSFET 256 and the P-type MOSFET 257 replaces transmission gate 216. The multiplexer 150 requires inverters 251 and 255 to internally generate dual-rail signals. Thus multiplexer 150 requires 22 transistors. These two inverters thus require four more transistors than the TG-TG-INV multiplexer 140. There are situations where multiplexer 150 consumes static power. For example, consider a combination of input signals (S0, S1, I1, I2, I3, I4) with logic values (0, 0, 1, 1, 1, 1). Both intermediate signals at the inputs of inverters 251 and 255 are at logic 1. The N-type MOSFET 252, and the P-type MOSFETs 253 and 257 are conducting while the N-type MOSFET 256 is off. A resistive logic 0 propagates through P-type MOSFET 257 to the input of inverter 240 while a driving logic 1 propagates in parallel through N-type MOSFET 256 and P-type MOSFET 257 to the input of inverter 240. This voltage contention results in the input of inverter 240 being pulled down from the supply voltage and static power dissipation at the output inverter. The output speed of multiplexer 150 is also degraded due to the voltage contention.

Figure 7:
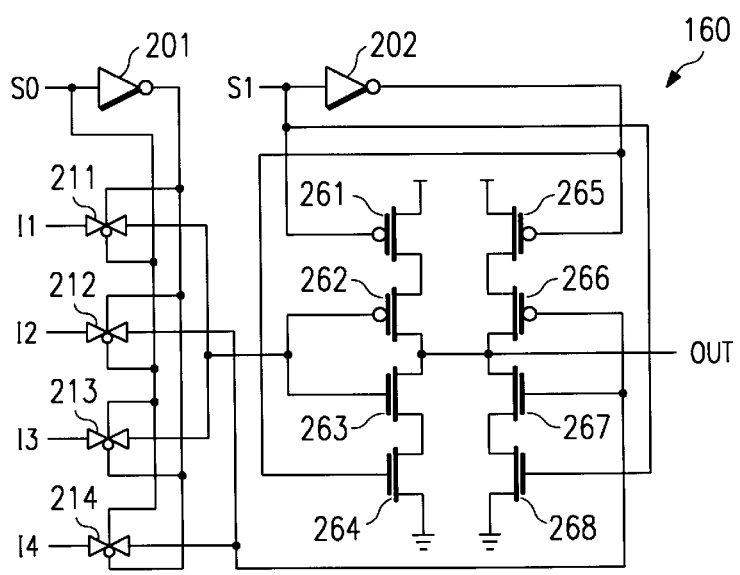
FIG. 7 illustrates a transmission gate-tristate inverter 4-to-1 multiplexer according to another embodiment of this invention.

Another embodiment of this invention is illustrated in FIG. 7. In order to reduce the short-circuit power dissipation of TG-INV-TG multiplexer 140 but maintain an active second stage component a tristate inverter circuit replaces the INV-TG portion of multiplexer 140. This TG-tristate multiplexer 160 includes a first tristate inverter consisting of P-type MOSFETs 261 and 262 and N-type MOSFETs 263 and 264 and second tristate inverter consisting of P-type MOSFETs 265 and 266 and N-type MOSFETs 267 and 268. Multiplexer 160 utilizes 20 transistors, the same number of transistors as TG-INV-TG multiplexer 140. Compared to TG-INV-TG multiplexer 140 , TG-tristate multiplexer 160 reduces total power dissipation by about 14%. The TG-tristate multiplexer 160 reduces the worst case delay paths from 4/2/3 of TG-INV-TG multiplexer 140 to 3/3/2. The stacked MOSFETs of the two tristate inverters slows down the performance.

Figure 9:
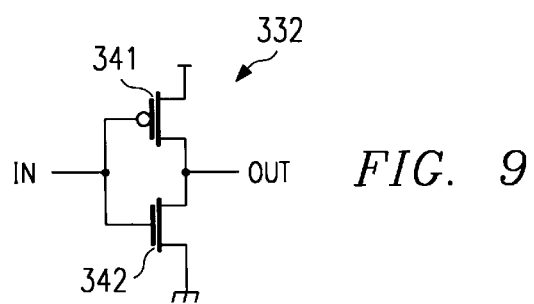
FIG. 9 illustrates an inverter circuit.
Figure 8:
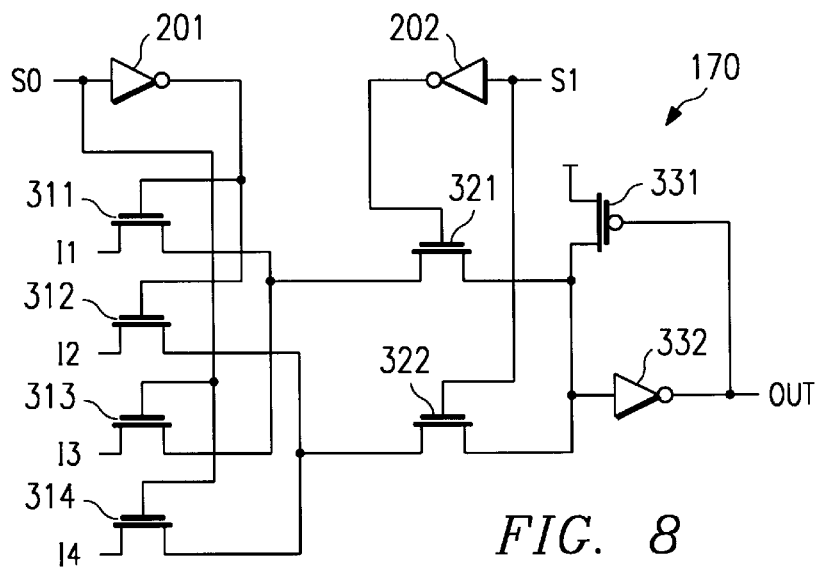
FIG. 8 illustrates an enhanced-CPL 4-to-1 multiplexer according to another embodiment of this invention.

Based on the above discussion, it would be desirable to either reduce power dissipation of TG-INV-TG multiplexer 140 or to improve the speed of TG-TG-INV multiplexer 130. Another embodiment of this invention removes the P-type MOSFETs from the transmission gates of the TG-TG-INV multiplexer 130 to reduce capacitive loading from junction capacitance and hence shorten the propagation delay. This is the enhanced-CPL multiplexer 170 illustrated in FIG. 8. The output inverter has P-type MOSFET 331 that pulls the input voltage level of the output inverter 332 to rail and eliminates the static power dissipation. To further improve the speed, the channel size of N-type MOSFETs 311, 312, 313, 314, 321 and 322 may be increased to reduce resistivity of channels and therefore, its total transistor area is comparable to that of TG-TG-INV multiplexer 130 even though only 13 transistors are used. Another technique to enhance the performance is to lower the inverter threshold voltage by increasing the channel size its N-type MOSFET and reducing the channel size of its P-type MOSFET. Each inverter 201, 202 and 332 is formed of a P-type MOSFET 341 and an N-type MOSFET 342 as illustrated in FIG. 9. In the case of inverter 332, N-type MOSFET 342 is formed larger than P-type MOSFET 341. This causes the conductivity of N-type MOSFET 342 to be greater than the conductivity of P-type MOSFET 341 resulting in the inverter threshold voltage shift. This sizing also yields a more balanced low-to-high and high-to-low switching delay.

Table 2 shows the relative performance and power dissipation of the three prior art multiplexers, namely the prior art multiplexer 110, the three 2-to-1 multiplexer 120, and the TG-TG-INV multiplexer 130, are compared to the four embodiments of this invention, namely the TG-INV-TG multiplexer 140, the TG-DPL-INV multiplexer 150, the TG-tristate multiplexer 160 and the enhanced-CPL multiplexer 170. This evaluation was done using a 0.6 μm CMOS technology with a supply voltage of 3.3 V, a temperature of 25° C., and a nominal process model. The delay was obtained from arithmetic average of propagation delays from each input to output transition and the power was measured as the average power dissipation with a 50% input transition density. The input signal frequency was 100 MHz and its slew was 0.5 ns. The output was loaded with three standard loads with each standard load being defined as a minimum size inverter for the technology. The average delay and power of the prior art multiplexer 110 from nominal SPICE simulations yields 491 ns and 127.1 μW, respectively. The power delay product or energy consumption is 62.41 fJ. Compared to the prior art multiplexer 110, the three 2-to-1 multiplexer 120 improves the power dissipation by 5% but increases the delay by 7%. Both multiplexers 110 and 120 consume comparable energy. The TG-TG-INV multiplexer 130 reduces power dissipation by 17% and enhances performance by 24% relative to the prior art multiplexer 110 and boosts the energy efficiency by 49%. On the averaged delay, the TG-INV-TG multiplexer 140 is 43% faster than the prior art multiplexer 110, and 19% faster than TG-TG-INV multiplexer 130. From the power dissipation stand point, the TG-INV-TG multiplexer 140 exposes any input transitions directly to the two inverters causing additional capacitive and short-circuit power dissipation. The TG-INV-TG multiplexer 140 consumes 19% more power than the prior art multiplexer 110 and 36% more power than the TG-TG-INV multiplexer 130. The TG-DPL-INV multiplexer 150 is a very energy-inefficient option. The TG-tristate multiplexer 160 has an energy efficiency 10% better than that of the TG-INV-TG multiplexer 140 although both multiplexers have comparable performance advantage over the three prior art multiplexers 110, 120 and 130. The enhanced-CPL multiplexer 170 has lower power dissipation by 5% and reduced the delay by 16%, relative to the TG-TG-INV multiplexer 130. Compared with the TG-TG-INV multiplexer 130, the energy efficiency of the enhanced-CPL multiplexer 170 is better by 22%. Compared with the conventional multiplexer 100 the energy efficiency of the enhanced-CPL multiplexer 170 is better by 71%.

Overall, the TG-INV-TG multiplexer 140 is the fastest design. Relative to the three prior art multiplexers 110, 120 and 130, the TG-INV-TG multiplexer 140 improves the performance by 19–50%. The enhanced-CPL multiplexer 170 dissipates the least amount of power. When compared to the three prior art multiplexers 110, 120 and 130, the enhanced-CPL multiplexer 170 reduces power dissipation by 5–22% and at the same time delivers 16–47% faster performance. The enhanced-CPL multiplexer 150 is the most energy-efficient design in power-delay product. The enhanced-CPL multiplexer 150 improves the energy efficiency by 22–72% relative to the prior art designs.

The proposed enhanced-CPL multiplexer 150 is the most energy-efficient implementation among the seven circuits investigated. The next step is to analyze their characteristics under low supply voltages. If only the supply voltage (Vdd) is scaled with fixed threshold voltages (Vt), U. Ko et al, "LOW POWER DESIGN TECHNIQUES FOR HIGH PERFORMANCE CMOS ADDERS", *IEEE TRANSACTIONS ON VLSI SYSTEMS*, Vol.3, No. 2, June 1995, pages 327 to 333 states that the delay penalty of enhanced-CPL multiplexer 170 is high at low voltage. To minimize performance degradation at low voltage, this section summarizes the multiplexer characteristics assuming transistor threshold voltages are scaled at ⅕ of the supply voltage.

Figure 10:
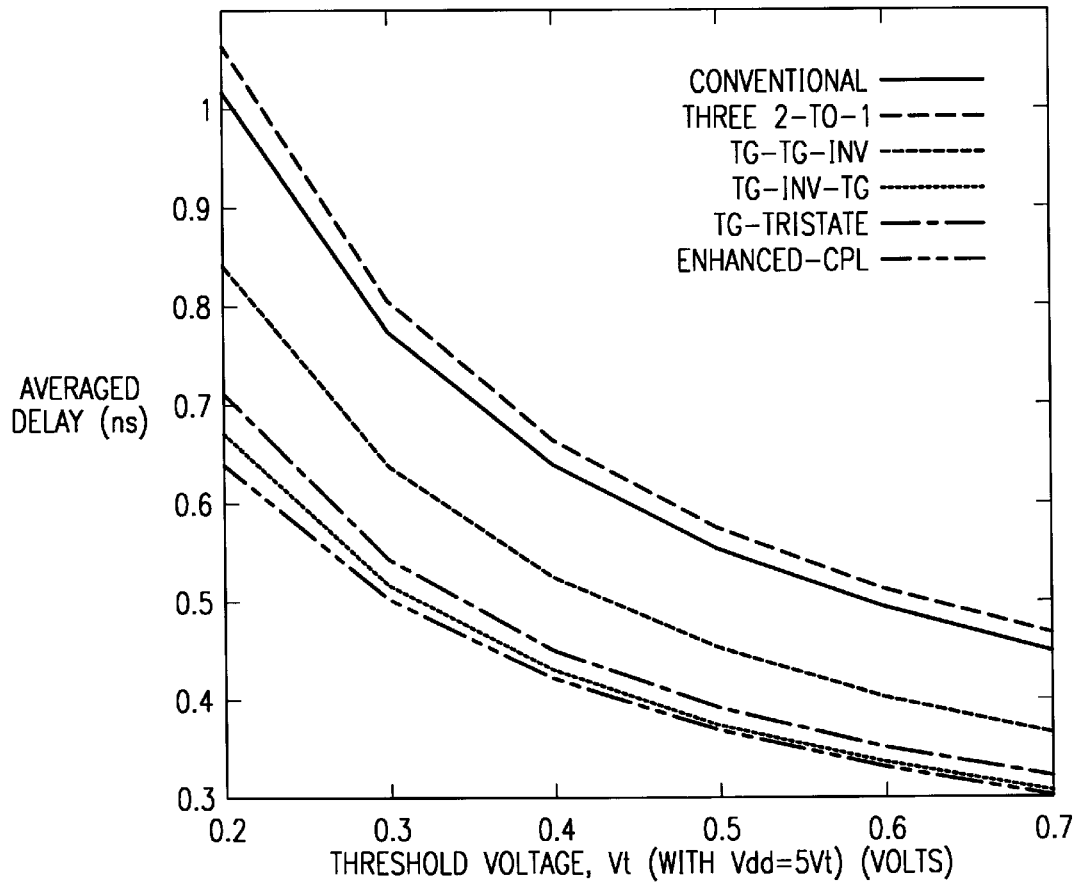
FIG. 10 illustrates the relationship between the average multiplexer delay in nanosecond and the transistor threshold voltage at a fixed power supply voltage for various 4-to-1 multiplexers described in this application.
Figure 11:
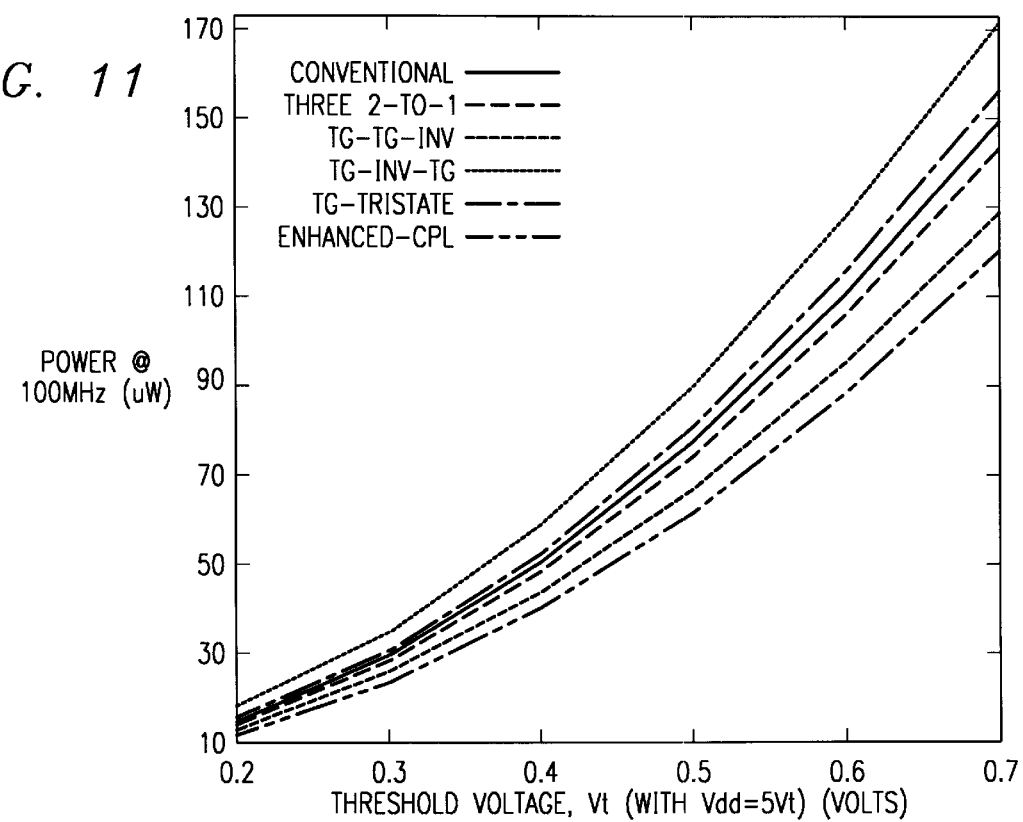
FIG. 11 illustrates the relationship between the power consumed in microwatts and transistor threshold voltage at a fixed power supply voltage for various 4-to-1 multiplexers described in this application.

The dependency of the multiplexer delay and power on Vt and Vdd scaling is depicted in FIGS. 9 and 10, respectively. Over the voltage range compared in FIG. 10, the proposed enhanced-CPL multiplexer 170 is 20–66% faster than the three prior art multiplexers 110, 120 and 130. The TG-INV-TG multiplexer 140 and the TG-tristate multiplexer 160 are 19–58% faster than the three prior art multiplexers 110, 120 and 130. When changing from a supply voltage of 3.5 V to 1.0 V, the enhanced-CPL multiplexer 170 experiences a performance degradation factor of 2.09 while the three prior art multiplexers 110, 120 and 130 suffer by an average degradation factor of 2.27. From FIG. 11, the proposed enhanced-CPL multiplexer 170 dissipates 7–52% less power than the other five multiplexers over the voltage range investigated. The TG-INV-TG multiplexer 140 and TG-tristate multiplexer 160 are 11–58% faster than the three prior art multiplexers 110, 120 and 130 as shown in FIG. 10. This is at the expense of consuming 4–38% more power as shown in FIG. 11. These multiplexers expose internal active gates to data inputs transitions. On an average, a power reduction factor of 10.1 is accomplished when Vdd (Vt) is scaled from 3.5 V (0.7 V) down to 1.0 V (0.2 V).

Figure 12:
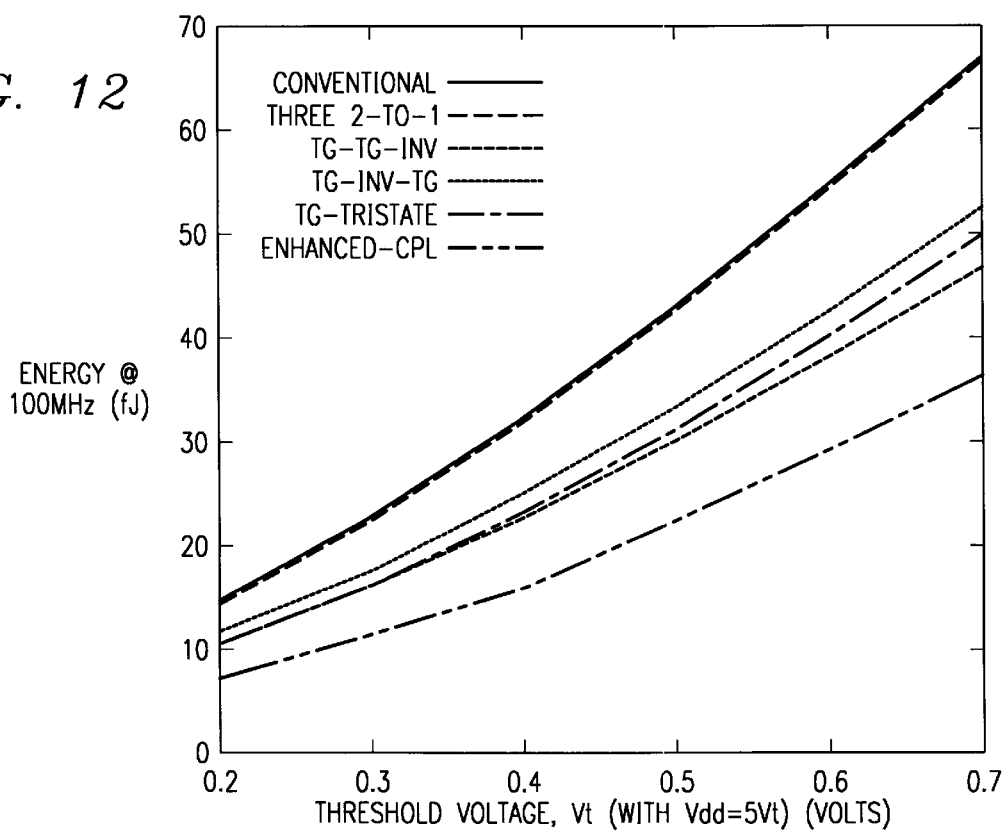
FIG. 12 illustrates the relationship between the energy consumption in femtoJoules and transistor threshold voltage at a fixed power supply voltage for various 4-to-1 multiplexers described in this application.

The dependency of energy consumption on Vt and Vdd is shown in FIG. 12. Over the voltage range analyzed, the prior art multiplexer 110 and the three 2-to-1 multiplexers 120 consume about the same energy. Relative to the TG-TG-INV

TABLE 2

| Parameters 3.3 V, 100 MHz # of transistors | Conventional | Three 2-to-1 | TG-TG-INV | TG-INV-TG | TG-DPL-INV | TG-Tristate | Enhanced-CPL | Units |
|---|---|---|---|---|---|---|---|---|
| | 38 | 24 | 18 | 20 | 18 | 20 | 13 | tr. |
| Width of transistors | 69.3 | 48.4 | 34 | 61.6 | 42.4 | 75.2 | 32.5 | μm |
| IN to OUT | 6/6/2 | 6/4/5 | 4/3/3 | 4/2/3 | 4/3/4 | 3/3/2 | 4/2/3 | tr. |
| Power, average | 127.1 | 122.0 | 108.8 | 146.0 | 235.6 | 132.3 | 103.9 | μw |
| Percentage | 122 | 117 | 105 | 141 | 227 | 127 | 100 | % |
| Delay, average | 491 | 517.1 | 409.3 | 340 | 432.4 | 349.2 | 351.6 | ps |
| Percentage | 140 | 147 | 116 | 97 | 123 | 99 | 100 | % |
| Energy | 62.41 | 63.00 | 44.53 | 49.64 | 101.9 | 46.2 | 36.53 | fJ |
| percentage | 171 | 172 | 122 | 136 | 279 | 126 | 100 | % | multiplexer 130 and the prior art multiplexer 110, the proposed enhanced-CPL multiplexer 170 provides better energy utilization by 29–45% and 84–101%, respectively. On an average, the energy efficiency of the enhanced-CPL multiplexer 170 is improved by a factor of 4.57 when Vdd is scaled from 3.5 V down to 1.0 V.

Figure 13:
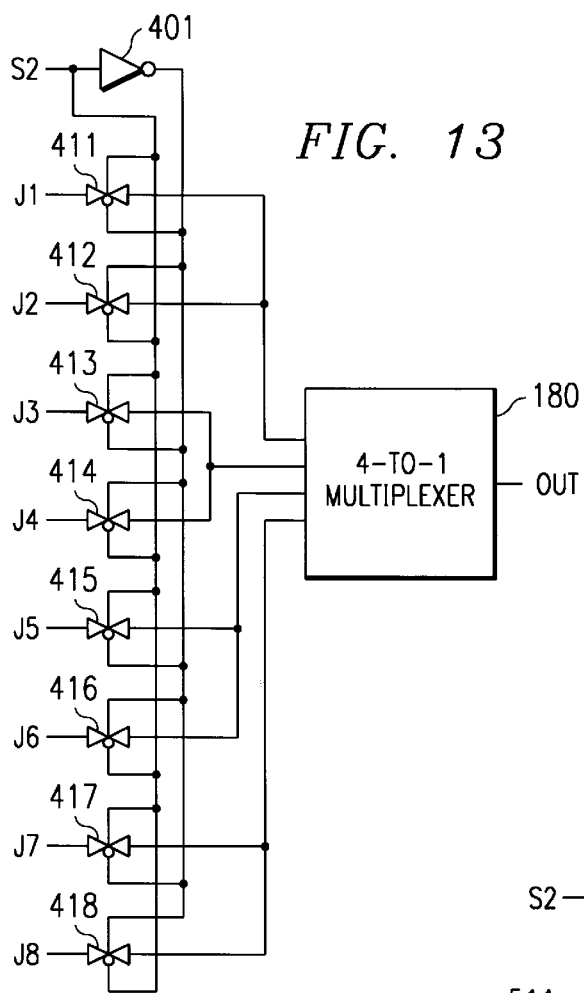
FIG. 13 illustrates a first technique for extending the 4-to-1 multiplexers of this invention to an 8-to-1 multiplexer.
Figure 14:
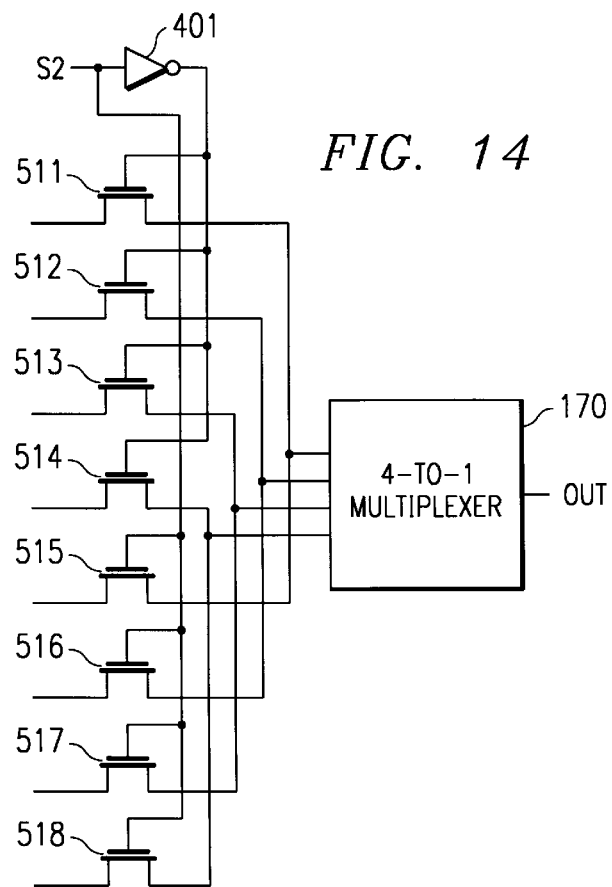
FIG. 14 illustrates a second technique for extending the 4-to-1 multiplexer of FIG. 8 of this invention to an 8-to-1 multiplexer.

FIG. 13 illustrates a technique for extending the multiplexers of this invention to 8-to-1 multiplexers. An additional set of transmission gates 411 to 418 receive the eight input signals J1 to J8, respectively. A third select signal S2 supplies the input of inverter 401. Transmission gates 411 to 418 are coupled to the third select signal S2 or its inverse from inverter 401 in alternating phases. Transmission gates driven in opposite phases are connected in a wired OR fashion to one of the inputs of 4-to-1 multiplexer 180. The 4-to-1 multiplexer 180 could be constructed in accordance any of multiplexers 14, 150, 160 or 170 as illustrated in FIGS. 5, 6, 7 or 8, respectively. FIG. 14 illustrates an alternative technique for extending the multiplexer 170 of FIG. 8. FIG. 14 includes N-type MOSFETs 511 to 518 receiving the eight input signals J1 to J8, respectively. The gate of N-type MOSFETs 511 to 518 are coupled to either the third select signal S2 or its inverse from inverter 401. The N-type MOSFETs driven in opposite phases are connected in a wired OR fashion to one of the inputs of 4-to-1 multiplexer 170.

Each of the 4-to-1 multiplexers 140, 150, 160 and 170 may be converted to a 2-to-1 multiplexer by removing the front end circuits. Multiplexers 140, 150 and 160 may be converted to a 2-to-1. multiplexer by omitting inverter 201 and the transmission gates 211, 212, 213 and 214. In multiplexer 140, the two inputs would be supplied to the inputs of inverters 241 and 242, respectively. In multiplexer 150, the two inputs would be supplied to the inputs of inverters 251 and 255, respectively. In multiplexer 160, the two inputs would be supplied to the inputs of the tristate inverters at (1) the gates of P-type MOSFET 262 and N-type MOSFET 263, and (2) the gates of P-type MOSFET 266 and N-type MOSFET 267, respectively. Multiplexer 170 can be converted to a 2-to-1 multiplexer by omitting inverter 201 and N-type MOSFETs 311, 312, 313 and 314, and supplying the two inputs to N-type MOSFETs 321 and 322, respectively.

What is claimed is:

1. A 4-to-1 multiplexer having first, second, third and fourth inputs receiving respective first, second, third and fourth input signals, having first and second control inputs receiving respective first and second select input signals and an output, said first and second select input signals each having either a first logic state or a second logic state, said 4-to-1 multiplexer coupling said input at one of said first, second, third or fourth inputs to said output corresponding to said input at said first and second control input, said 4-to-1 multiplexer comprising:

a first control signal inverter having an input connected to said first control signal input and an output;

a second control signal inverter having an input connected to said second control signal input and an output;

a first transmission gate having an input connected to said first signal input, an output and connected to said first control signal input and said output of said first control signal inverter in a first phase causing said first transmission gate to conduct between said input and said output when said first control signal has said first logic state;

a second transmission gate having an input connected to said second signal input, an output and connected to said first control signal input and said output of said first control signal inverter in said first phase causing said second transmission gate to conduct between said input and said output when said first control signal has said first logic state;

a third transmission gate having an input connected to said third signal input, an output and connected to said first control signal input and said output of said first control signal inverter in a second phase causing said third transmission gate to conduct between said input and said output when said first control signal has said second logic state;

a fourth transmission gate having an input connected to said fourth signal input, an output and connected to said first control signal input and said output of said first control signal inverter in said second phase causing said fourth transmission gate to conduct between said input and said output when said first control signal has said second logic state;

a first intermediate inverter having an input connected jointly to said output of said first transmission gate and said output of said second transmission gate and having an output;

a first N-type MOSFET having a source-drain path connected between said input of said first intermediate inverter and a first intermediate node, and having a gate connected to said output of said second control signal inverter;

a first P-type MOSFET having a source-drain path connected between said output of said second control signal inverter and said first intermediate node, and having a gate connected to said output of said first intermediate inverter;

a second intermediate inverter having an input connected jointly to said output of said third transmission gate and said output of said fourth transmission gate and having an output;

a second N-type MOSFET having a source-drain path connected between said input of said second intermediate inverter and a second intermediate node, and having a gate connected to said second control signal input;

a second P-type MOSFET having a source-drain path connected between said output of said second control signal inverter and said second intermediate node, and having a gate connected to said output of said second intermediate inverter;

an output inverter having an input jointly connected to said first and second intermediate nodes, and having an output connected to said output of said 4-to-1 multiplexer.

2. An 8-to-1 multiplexer having first, second, third, fourth, fifth, sixth, seventh and eighth inputs receiving respective first, second, third, fourth, fifth, sixth, seventh and eighth input signals, having first, second and third control inputs receiving respective first, second and third select input signals and an output, said first, second and third select input signals each having either a first logic state or a second logic state, said 8-to-1 multiplexer coupling said input at one of said first, second, third, fourth, fifth, sixth, seventh or eighth inputs to said output corresponding to said input at said first, second and third control inputs, said 8-to-1 multiplexer comprising:

a first control signal inverter having an input connected to said first control signal input and an output;

a second control signal inverter having an input connected to said second control signal input and an output;

a third control signal inverter having an input connected to said third control signal input and an output;

a first transmission gate having an input connected to said first signal input, an output and connected to said first control signal input and said output of said first control signal inverter in a first phase causing said first transmission gate to conduct between said input and said output when said first control signal has said first logic state;

a second transmission gate having an input connected to said second signal input, an output and connected to said first control signal input and said output of said first control signal inverter in a second phase causing said second transmission gate to conduct between said input and said output when said first control signal has said second logic state;

a third transmission gate having an input connected to said third signal input, an output and connected to said first control signal input and said output of said first control signal inverter in said first phase causing said third transmission gate to conduct between said input and said output when said first control signal has said first logic state;

a fourth transmission gate having an input connected to said fourth signal input, an output and connected to said first control signal input and said output of said first control signal inverter in said second phase causing said fourth transmission gate to conduct between said input and said output when said first control signal has said second logic state;

a fifth transmission gate having an input connected to said fifth signal input, an output and connected to said first control signal input and said output of said first control signal inverter in said first phase causing said fifth transmission gate to conduct between said input and said output when said first control signal has said first logic state;

a sixth transmission gate having an input connected to said sixth signal input, an output and connected to said first control signal input and said output of said first control signal inverter in said second phase causing said sixth transmission gate to conduct between said input and said output when said first control signal has said second logic state;

a seventh transmission gate having an input connected to said seventh signal input, an output and connected to said first control signal input and said output of said first control signal inverter in said first phase causing said seventh transmission gate to conduct between said input and said output when said first control signal has said first logic state;

an eighth transmission gate having an input connected to said eighth signal input, an output and connected to said first control signal input and said output of said first control signal inverter in said second phase causing said eighth transmission gate to conduct between said input and said output when said first control signal has said second logic state;

a ninth transmission gate having an input jointly connected to said output of said first transmission gate and said output of said second transmission gate, an output and connected to said second control signal input and said output of said second control signal inverter in a first phase causing said ninth transmission gate to conduct between said input and said output when said second control signal has said first logic state;

a tenth transmission gate having an input jointly connected to said output of said third transmission gate and said output of said fourth transmission gate, an output and connected to said second control signal input and said output of said second control signal inverter in said first phase causing said tenth transmission gate to conduct between said input and said output when said second control signal has said first logic state;

a eleventh transmission gate having an input jointly connected to said output of said fifth transmission gate and said output of said sixth transmission gate, an output and connected to said second control signal input and said output of said second control signal inverter in a second phase causing said eleventh transmission gate to conduct between said input and said output when said second control signal has said second logic state;

a twelveth transmission gate having an input jointly connected to said output of said seventh transmission gate and said output of said eighth transmission gate, an output and connected to said second control signal input and said output of said second control signal inverter in said second phase causing said twelveth transmission gate to conduct between said input and said output when said second control signal has said second logic state;

a first intermediate inverter having an input connected jointly to said output of said ninth transmission gate and said output of said tenth transmission gate and having an output;

a first N-type MOSFET having a source-drain path connected between said input of said first intermediate inverter and a first intermediate node, and having a gate connected to said output of said third control signal inverter;

a first P-type MOSFET having a source-drain path connected between said output of said third control signal inverter and said first intermediate node, and having a gate connected to said output of said first intermediate inverter;

a second intermediate inverter having an input connected jointly to said output of said eleventh transmission gate and said output of said twelveth transmission gate and having an output;

a second N-type MOSFET having a source-drain path connected between said input of said second intermediate inverter and a second intermediate node, and having a gate connected to said third control signal input;

a second P-type MOSFET having a source-drain path connected between said output of said third control signal inverter and said second intermediate node, and having a gate connected to said output of said second intermediate inverter;

an output inverter having an input jointly connected to said first and second intermediate nodes, and having an output connected to said output of said 8-to-1 multiplexer.

3. A 2-to-1 multiplexer having first and second inputs receiving respective first and second input signals, having a control input receiving a select input signal and an output, said 2-to-1 multiplexer coupling said input at one of said first or second inputs to said output corresponding to said input at said control input, said 2-to-1 multiplexer comprising:

a control signal inverter having an input connected to said control signal input and an output;

a first inverter having an input connected to said first input and having an output;

a first N-type MOSFET having a source-drain path connected between said input of said first inverter and a first node, and having a gate connected to said output of said control signal inverter;

a first P-type MOSFET having a source-drain path connected between said output of said control signal inverter and said first node, and having a gate connected to said output of said first inverter;

a second inverter having an input connected to said second input and having an output;

a second N-type MOSFET having a source-drain path connected between said input of said second inverter and a second node, and having a gate connected to said control signal input;

a second P-type MOSFET having a source-drain path connected between said output of said control signal inverter and said second node, and having a gate connected to said output of said second inverter;

an output inverter having an input jointly connected to said first and second nodes, and having an output connected to said output of said 2-to-1 multiplexer.

4. A 4-to-1 multiplexer having first, second, third and fourth inputs receiving respective first, second, third and fourth input signals, having first and second control inputs receiving respective first and second select input signals and an output, said first and second select input signals each having either a first logic state or a second logic state, said 4-to-1 multiplexer coupling said input at one of said first, second, third or fourth inputs to said output corresponding to said input at said first and second control input, said 4-to-1 multiplexer comprising:

a first control signal inverter having an input connected to said first control signal input and an output;

a second control signal inverter having an input connected to said second control signal input and an output;

a first transmission gate having an input connected to said first signal input, an output and connected to said first control signal input and said output of said first control signal inverter in a first phase causing said first transmission gate to conduct between said input and said output when said first control signal has said first logic state;

a second transmission gate having an input connected to said second signal input, an output and connected to said first control signal input and said output of said first control signal inverter in said first phase causing said second transmission gate to conduct between said input and said output when said first control signal has said first logic state;

a third transmission gate having an input connected to said third signal input, an output and connected to said first control signal input and said output of said first control signal inverter in a second phase causing said third transmission gate to conduct between said input and said output when said first control signal has said second logic state;

a fourth transmission gate having an input connected to said fourth signal input, an output and connected to said first control signal input and said output of said first control signal inverter in said second phase causing said fourth transmission gate to conduct between said input and said output when said first control signal has said second logic state;

a first tristate inverter including
a first P-type MOSFET having a source-drain path connected between a supply voltage and a first intermediate node and a gate connected to said second control input,
a second P-type MOSFET having a source-drain path connected between said first intermediate node and said output of said 4-to-1 multiplexer and a gate jointly connected to said outputs of said first and third transmission gates,
a first N-type MOSFET having a source-drain path connected between said output of said 4-to-1 multiplexer and a second intermediate node and a gate jointly connected to said outputs of said first and third transmission gates,
a second N-type MOSFET having a source-drain path connected between said second intermediate node and a reference voltage and a gate connected to said output of said first control signal inverter;

a second tristate inverter including
a third P-type MOSFET having a source-drain path connected between said supply voltage and a third intermediate node and a gate receiving said output of said second control signal inverter,
a fourth P-type MOSFET having a source-drain path connected between said third intermediate node and said output of said 4-to-1 multiplexer and a gate jointly connected to said outputs of said second and fourth transmission gates,
a third N-type MOSFET having a source-drain path connected between said output of said 4-to-1 multiplexer and a fourth intermediate node and a gate jointly connected to said outputs of said second and fourth transmission gates,
a fourth N-type MOSFET having a source-drain path connected between said fourth intermediate node and a reference voltage and a gate connected to said second control input.

5. An 8-to-1 multiplexer having first, second, third, fourth, fifth, sixth, seventh and eighth inputs receiving respective first, second, third, fourth, fifth, sixth, seventh and eighth input signals, having first, second and third control inputs receiving respective first, second and third select input signals and an output, said first, second and third select input signals each having either a first logic state or a second logic state, said 8-to-1 multiplexer coupling said input at one of said first, second, third, fourth, fifth, sixth, seventh or eighth inputs to said output corresponding to said input at said first, second and third control inputs, said 8-to-1 multiplexer comprising:

a first control signal inverter having an input connected to said first control signal input and an output;

a second control signal inverter having an input connected to said second control signal input and an output;

a third control signal inverter having an input connected to said third control signal input and an output;

a first transmission gate having an input connected to said first signal input, an output and connected to said first control signal input and said output of said first control signal inverter in a first phase causing said first transmission gate to conduct between said input and said output when said first control signal has said first logic state;

a second transmission gate having an input connected to said second signal input, an output and connected to said first control signal input and said output of said first control signal inverter in a second phase causing said second transmission gate to conduct between said input and said output when said first control signal has said second logic state;

a third transmission gate having an input connected to said third signal input, an output and connected to said first control signal input and said output of said first control signal inverter in said first phase causing said third transmission gate to conduct between said input and said output when said first control signal has said first logic state;

a fourth transmission gate having an input connected to said fourth signal input, an output and connected to said first control signal input and said output of said first control signal inverter in said second phase causing said fourth transmission gate to conduct between said input and said output when said first control signal has said second logic state;

a fifth transmission gate having an input connected to said fifth signal input, an output and connected to said first control signal input and said output of said first control signal inverter in said first phase causing said fifth transmission gate to conduct between said input and said output when said first control signal has said first logic state;

a sixth transmission gate having an input connected to said sixth signal input, an output and connected to said first control signal input and said output of said first control signal inverter in said second phase causing said sixth transmission gate to conduct between said input and said output when said first control signal has said second logic state;

a seventh transmission gate having an input connected to said seventh signal input, an output and connected to said first control signal input and said output of said first control signal inverter in said first phase causing said seventh transmission gate to conduct between said input and said output when said first control signal has said first logic state;

an eighth transmission gate having an input connected to said eighth signal input, an output and connected to said first control signal input and said output of said first control signal inverter in said second phase causing said eighth transmission gate to conduct between said input and said output when said first control signal has said second logic state;

a ninth transmission gate having an input jointly connected to said output of said first transmission gate and said output of said second transmission gate, an output and connected to said second control signal input and said output of said second control signal inverter in a first phase causing said ninth transmission gate to conduct between said input and said output when said second control signal has said first logic state;

a tenth transmission gate having an input jointly connected to said output of said third transmission gate and said output of said fourth transmission gate, an output and connected to said second control signal input and said output of said second control signal inverter in said first phase causing said tenth transmission gate to conduct between said input and said output when said second control signal has said first logic state;

a eleventh transmission gate having an input jointly connected to said output of said fifth transmission gate and said output of said sixth transmission gate, an output and connected to said second control signal input and said output of said second control signal inverter in a second phase causing said eleventh transmission gate to conduct between said input and said output when said second control signal has said second logic state;

a twelveth transmission gate having an input jointly connected to said output of said seventh transmission gate and said output of said eighth transmission gate, an output and connected to said second control signal input and said output of said second control signal inverter in said second phase causing said twelveth transmission gate to conduct between said input and said output when said second control signal has said second logic state;

a first tristate inverter including
 a first P-type MOSFET having a source-drain path connected between a supply voltage and a first intermediate node and a gate connected to said third control input,
 a second P-type MOSFET having a source-drain path connected between said first intermediate node and said output of said 8-to-1 multiplexer and a gate jointly connected to said outputs of said ninth and eleventh transmission gates,
 a first N-type MOSFET having a source-drain path connected between said output of said 8-to-1 multiplexer and a second intermediate node and a gate jointly connected to said outputs of said ninth and eleventh transmission gates,
 a second N-type MOSFET having a source-drain path connected between said second intermediate node and a reference voltage and a gate connected to said output of said third control signal inverter;

a second tristate inverter including
 a third P-type MOSFET having a source-drain path connected between said supply voltage and a third intermediate node and a gate receiving said output of said third control signal inverter,
 a fourth P-type MOSFET having a source-drain path connected between said third intermediate node and said output of said 8-to-1 multiplexer and a gate jointly connected to said outputs of said tenth and twelveth transmission gates,
 a third N-type MOSFET having a source-drain path connected between said output of said 8-to-1 multiplexer and a fourth intermediate node and a gate jointly connected to said outputs of said tenth and twelveth transmission gates,
 a fourth N-type MOSFET having a source-drain path connected between said fourth intermediate node and a reference voltage and a gate connected to said third control input.

6. A 2-to-1 multiplexer having first and second inputs receiving respective first and second input signals, having a control input receiving a select input signal and an output, said 2-to-1 multiplexer coupling said input at one of said first and second inputs to said output corresponding to said input at said control input, said 2-to-1 multiplexer comprising:

a control signal inverter having an input connected to said control signal input and an output;

a first tristate inverter including
 a first P-type MOSFET having a source-drain path connected between a supply voltage and a first intermediate node and a gate connected to said control input, a second P-type MOSFET having a source-drain path connected between said first intermediate node and said output of said 2-to-1 multiplexer and a gate connected to said first input;

a first N-type MOSFET having a source-drain path connected between said output of said 2-to-1 multiplexer and a second intermediate node and a gate connected to said first input;

a second N-type MOSFET having a source-drain path connected between said second intermediate node and a reference voltage and a gate connected to said output of said control signal inverter;

a second tristate inverter including a third P-type MOSFET having a source-drain path connected between said supply voltage and a third intermediate node and a gate receiving said output of said control signal inverter, a fourth P-type MOSFET having a source-drain path connected between said third intermediate node and said output of said 2-to-1 multiplexer and a gate connected to said second input;

a third N-type MOSFET having a source-drain path connected between said output of said 2-to-1 multiplexer and a fourth intermediate node and a gate connected to said second input;

a fourth N-type MOSFET having a source-drain path connected between said fourth intermediate node and a reference voltage and a gate connected to said control input.

* * * * *